United States Patent
Ishiguro et al.

(10) Patent No.: US 10,224,448 B2
(45) Date of Patent: Mar. 5, 2019

(54) SOLAR CELL MODULE

(71) Applicant: Panasonic Intellectual Property Management Co., Ltd., Osaka-shi, Osaka (JP)

(72) Inventors: Tasuku Ishiguro, Osaka (JP); Naoto Imada, Tokyo (JP); Junpei Irikawa, Osaka (JP); Akimichi Maekawa, Osaka (JP)

(73) Assignee: PANASONIC INTELLECTUAL PROPERTY MANAGEMENT CO., Ltd., Osaka (JP)

(*) Notice: Subject to any disclaimer, the term of this patent is extended or adjusted under 35 U.S.C. 154(b) by 0 days.

(21) Appl. No.: 15/374,291

(22) Filed: Dec. 9, 2016

(65) Prior Publication Data

US 2017/0092796 A1 Mar. 30, 2017

Related U.S. Application Data

(63) Continuation of application No. PCT/JP2015/002621, filed on May 25, 2015.

(30) Foreign Application Priority Data

Jun. 13, 2014 (JP) ................. 2014-122136

(51) Int. Cl.
*B32B 3/08* (2006.01)
*B32B 3/18* (2006.01)
(Continued)

(52) U.S. Cl.
CPC ............. *H01L 31/055* (2013.01); *B32B 3/08* (2013.01); *B32B 3/18* (2013.01); *B32B 3/266* (2013.01);
(Continued)

(58) Field of Classification Search
CPC ............. H01L 31/055; H01L 31/02322; H01L 31/048; H01L 31/0481; H01L 31/0488; Y02E 10/50
See application file for complete search history.

(56) References Cited

U.S. PATENT DOCUMENTS

| | | | |
|---|---|---|---|
| 2011/0126889 A1* | 6/2011 | Bourke, Jr. ........... | H01L 31/055 136/253 |
| 2013/0125985 A1 | 5/2013 | Sawaki et al. | |

(Continued)

FOREIGN PATENT DOCUMENTS

| | | |
|---|---|---|
| EP | 2 555 253 A1 | 2/2013 |
| EP | 2 579 329 A1 | 4/2013 |

(Continued)

OTHER PUBLICATIONS

International Search Report dated Jun. 30, 2015, issued in counterpart International Application No. PCT/JP2015/002621 (1 page).

(Continued)

*Primary Examiner* — Lindsey A Bernier
(74) *Attorney, Agent, or Firm* — Westerman, Hattori, Daniels & Adrian, LLP

(57) ABSTRACT

A solar cell module including: a solar cell; a first protection member provided on the light receiving surface side of the solar cell; a second protection member provided on the rear surface side of the solar cell; an encapsulant layer, including a first encapsulant layer disposed between the solar cell and the first protection member, and a second encapsulant layer disposed between the solar cell and the second protection member, which seals the solar cell; and a wavelength conversion substance, contained in at least the first encapsulant layer, which absorbs light having a specified wavelength, and converts the wavelength. The concentration of the wavelength conversion substance is higher in the first encapsulant layer than in the second encapsulant layer, and (Continued)

a resin constituting the second encapsulant layer has a smaller diffusion coefficient of the wavelength conversion substance than the diffusion coefficient of a resin constituting the first encapsulant layer.

7 Claims, 3 Drawing Sheets

(51) Int. Cl.
    *B32B 3/26*     (2006.01)
    *B32B 7/04*     (2006.01)
    *B32B 9/04*     (2006.01)
    *B32B 15/09*     (2006.01)
    *B32B 15/20*     (2006.01)
    *B32B 27/00*     (2006.01)
    *B32B 27/32*     (2006.01)
    *B32B 27/36*     (2006.01)
    *B32B 27/38*     (2006.01)
    *B32B 27/40*     (2006.01)
    *H02S 40/20*     (2014.01)
    *B32B 15/085*     (2006.01)
    *B32B 15/092*     (2006.01)
    *B32B 15/095*     (2006.01)
    *H01L 31/048*     (2014.01)
    *H01L 31/055*     (2014.01)

(52) U.S. Cl.
CPC .............. *B32B 7/045* (2013.01); *B32B 9/045* (2013.01); *B32B 15/085* (2013.01); *B32B 15/09* (2013.01); *B32B 15/092* (2013.01); *B32B 15/095* (2013.01); *B32B 15/20* (2013.01); *B32B 27/00* (2013.01); *B32B 27/32* (2013.01); *B32B 27/36* (2013.01); *B32B 27/38* (2013.01); *B32B 27/40* (2013.01); *H01L 31/048* (2013.01); *H01L 31/0481* (2013.01); *H01L 31/0488* (2013.01); *H02S 40/20* (2014.12); *B32B 2250/05* (2013.01); *B32B 2264/10* (2013.01); *B32B 2264/102* (2013.01); *B32B 2307/20* (2013.01); *B32B 2307/3065* (2013.01); *B32B 2307/41* (2013.01); *B32B 2307/412* (2013.01); *B32B 2307/422* (2013.01); *B32B 2307/51* (2013.01); *B32B 2307/7242* (2013.01); *B32B 2307/732* (2013.01); *B32B 2457/12* (2013.01); *Y02E 10/50* (2013.01); *Y02E 10/52* (2013.01)

(56) References Cited

U.S. PATENT DOCUMENTS

| | | | |
|---|---|---|---|
| 2013/0139868 A1* | 6/2013 | Zhang | C09K 11/06 |
| | | | 136/247 |
| 2013/0174907 A1* | 7/2013 | Murasawa | B32B 27/327 |
| | | | 136/259 |
| 2013/0240020 A1* | 9/2013 | Lee | H01L 31/18 |
| | | | 136/251 |
| 2013/0340808 A1 | 12/2013 | Komatsu et al. | |

FOREIGN PATENT DOCUMENTS

| | | |
|---|---|---|
| JP | 2011-238639 A | 11/2011 |
| JP | 2013-045778 A | 3/2013 |
| JP | 2013-123037 A | 6/2013 |
| JP | 2013-187349 A | 9/2013 |
| WO | 2011/148951 A1 | 12/2011 |

OTHER PUBLICATIONS

Extended Search Report dated May 23, 2017, issued in counterpart European Application No. 15806594.6 (7 pages).

* cited by examiner

SOLAR CELL MODULE

CROSS-REFERENCE TO RELATED APPLICATIONS

The present application is a continuation under 35 U.S.C. § 120 of PCT/JP2015/002621, filed May 25, 2015, which is incorporated herein by reference and which claimed priority to Japanese Patent Application No. 2014-122136 filed on Jun. 13, 2014. The present application likewise claims priority under 35 U.S.C. § 119 to Japanese Patent Application No. 2014-122136 filed on Jun. 13, 2014, the entire content of which is also incorporated herein by reference.

TECHNICAL FIELD

The present disclosure relates to a solar cell module.

BACKGROUND

There is known a solar cell module including a wavelength conversion substance that absorbs light having a specified wavelength, and converts the wavelength. According to this solar cell module, light having a wavelength region that makes little contribution to power generation among incident light can be converted into light having a wavelength contributing greatly to power generation. For example, Patent Literature 1 discloses a solar cell module in which an encapsulant layer containing a wavelength conversion substance therein is disposed on the light receiving surface side of a solar cell.

CITATION LIST

Patent Literature

[Patent Literature 1]
  WO 2011/148951 A

SUMMARY

In the solar cell module, light is mostly incident from the light receiving surface side, and therefore the wavelength conversion substance is preferably disposed on the light receiving surface side of the solar cell from a viewpoint of improvement of wavelength conversion efficiency. However, there is a case where the wavelength conversion substance is diffused on the rear surface side of the solar cell by long term use of the solar cell module, and the concentration of the wavelength conversion substance on the light receiving surface side is reduced.

An aspect of a solar cell module according to the present disclosure includes: a solar cell; a first protection member provided on a light receiving surface side of the solar cell; a second protection member provided on a rear surface side of the solar cell; an encapsulant layer that includes a first encapsulant layer disposed between the solar cell and the first protection member, and a second encapsulant layer disposed between the solar cell and the second protection member, and seals the solar cell; and a wavelength conversion substance that is contained in at least the first encapsulant layer, and that absorbs light having a specified wavelength, and converts the wavelength, wherein concentration of the wavelength conversion substance in the first encapsulant layer is higher than concentration of the wavelength conversion substance in the second encapsulant layer, and resin constituting the second encapsulant layer has a smaller diffusion coefficient of the wavelength conversion substance than the diffusion coefficient of resin constituting the first encapsulant layer.

In an aspect of the solar cell module according to the present disclosure, a diffusion inhibiting layer constituted from a material having a smaller diffusion coefficient of the wavelength conversion substance than the diffusion coefficient of resin constituting the first encapsulant layer is provided between the first encapsulant layer and the second encapsulant layer.

According to a solar cell module of the present disclosure, a wavelength conversion substance disposed on the light receiving surface side of a solar cell can be inhibited from being diffused on the rear surface side of the solar cell.

DETAILED DESCRIPTION

Figure 1:
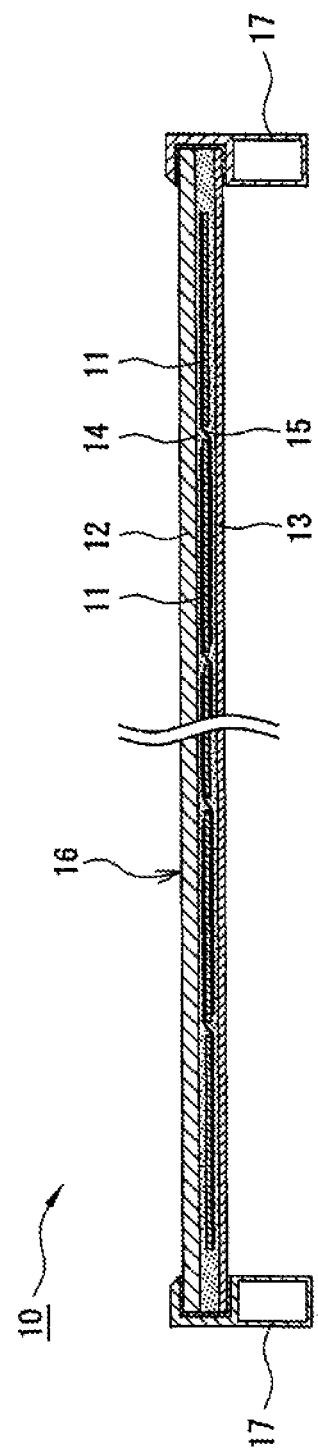
FIG. 1 is a sectional view of a solar cell module of as first embodiment.

Hereinafter, an example of embodiments will be described in detail with reference to the drawings.

The drawings referred to in the embodiments are schematically illustrated, and the dimension ratios of components illustrated in the drawing are sometimes different from the dimension ratios of real components. Specific dimension ratios and the like should be determined in consideration of the following description.

In this specification, a "light receiving surface" of each of a solar cell module, a solar cell, and a photoelectric conversion section means a surface on which light is mainly incident (incident from a light receiving surface upon which 50% to 100% of light is incident), while a "rear surface" means a surface opposite to the light receiving surface. Additionally, description that "a second member is provided on a first member" does not means only a case where the first and second members are provided so as to be in direct contact with each other, unless otherwise mentioned. That is, this description includes a case where another member exists between the first and second members. Description of "substantial . . . " is intended to include not only "entirely identical" but also "substantially the same", when "substantially the same" is taken as an example.

First Embodiment

Hereinafter, a solar cell module 10 of as first embodiment will be described in detail with reference to FIG. 1 and FIG. 2.

FIG. 1 is a sectional view of the solar cell module 10 which is an example of the embodiment.

As illustrated in FIG. 1, the solar cell module 10 includes solar cells 11, a first protection member 12 provided on the light receiving surface side of the solar cells 11, a second protection member 13 provided on the rear surface side of the solar cells 11, and an encapsulant layer 14 that seals the solar cells 11. The encapsulant layer 14 includes an encapsulant layer 14a (first encapsulant layer) disposed between the solar cells 11 and the first protection member 12, and an encapsulant layer 14b (second encapsulant layer) disposed between the solar cells 11 and the second protection member 13.

The solar cell module 10 includes wavelength conversion substances 30 contained in at least the encapsulant layer 14a (refer to FIG. 2 and the like described below). The wavelength conversion substances 30 are substances that absorb light having a specified wavelength to convert the wavelength, and play a role in converting light in a wavelength region hardly contributing to power generation into light a wavelength region contributing greatly to power generation.

In this embodiment, a plurality of the solar cells 11 are disposed on substantially the same plane. The adjacent solar cells 11 are connected in series by wiring materials 15, thereby forming as string of the solar cells 11. For example, each wiring material 15 bends in the module thickness direction between the adjacent solar cells 11, and is mounted on an electrode on the light receiving surface side of one of the solar cells 11 and an electrode on the rear surface side of the other solar cell 11 by an adhesive or the like.

The solar cells 11, the first protection member 12, the second protection member 13, and the encapsulant layer 14 constitute a solar cell panel 16. The solar cell panel 16 is a plate-like body in which a string of the solar cells 11 are disposed between the respective protection members, and has, for example, a substantially rectangular shape in plan view (when viewed from the direction perpendicular to the light receiving surface). A frame 17 is preferably mounted on an end edge of the solar cell panel 16. The frame 17 protects the end edge of the solar cell panel 16, and is utilized when the solar cell module 10 is installed on a roof or the like.

The solar cells 11 each include a photoelectric conversion section that generates carriers by receiving light. Each solar cell 11 has a light receiving surface electrode formed on the light receiving surface of the photoelectric conversion section and a rear surface electrode formed on a rear surface, as electrodes for collecting the carriers generated in the photoelectric conversion section. However, the structure of each solar cell 11 is not limited to the above, and may be, for example, a structure in which an electrode is formed only on the rear surface of the photoelectric conversion section. The rear surface electrode is preferably formed to have a larger area than the light receiving surface electrode, and it can be said that the surface having a lager electrode area (or a surface with an electrode formed thereon) is the "rear surface" of the solar cell 11.

The photoelectric conversion section has, for example, a semiconductor substrate, an amorphous semiconductor layer formed on the substrate, and a transparent conductive layer formed on the amorphous semiconductor layer. Examples of a semiconductor constituting the semiconductor substrate can include crystalline silicon (c-Si), gallium arsenide (GaAs), indium phosphide (InP) and the like. Examples of an amorphous semiconductor constituting the amorphous semiconductor layer can include an i-type amorphous silicon, an n-type amorphous silicon, a p-type amorphous silicon, and the like. The transparent conductive layer is preferably formed of transparent conductive oxide in which tin (Sn), antimony (Sb) or the like is doped in metal oxide such as indium oxide ($In_2O_3$) and zinc oxide (ZnO).

In this embodiment, an n-type single crystal silicon substrate is applied to the semiconductor substrate. The photoelectric conversion section has a structure in which an i-type amorphous silicon layer, a p-type amorphous silicon layer, and a transparent conductive layer are sequentially formed on the light receiving surface of the n-type single crystal silicon substrate, and an i-type amorphous silicon layer, an n-type amorphous silicon layer, and a transparent conductive layer are sequentially formed on the rear surface of the substrate. Alternatively, the p-type amorphous silicon layer may be formed on the rear surface side of the n-type single crystal silicon substrate, and the n-type amorphous silicon layer may be formed on the light receiving surface side of the substrate. That is the photoelectric conversion section has a junction of semiconductors having different optical gaps (heterojunction). An amorphous silicon layer (thickness: several run to several tens of nm) forming a heterojunction generally absorbs light having a wavelength of 600 nm or less.

For the first protection member 12, a member having transparency such as a glass substrate, a resin substrate and a resin film can be used. Among these, from a viewpoint of fire resistance, durability, and the like, the glass substrate is preferably used. The thickness of the glass substrate is not particularly limited, but is preferably about 2 mm to 6 mm.

For the second protection member 13, a transparent member which is the same as the first protection member 12 may be used, or an opaque member may be used. In this embodiment, a resin film is used as the second protection member 13. The resin film is not particularly limited, but is preferably a polyethylene terephthalate (PET) film. From a viewpoint of lowering moisture permeability and the like, in the resin film, an inorganic compound layer of silica or the like, or a metal layer of aluminum or the like may be formed in a case where it is not assumed that light is incident from the rear surface side. The thickness of the resin film is not particularly limited, but is preferably about 50 µm to 300 µm.

The encapsulant layer 14 plays a role in preventing moisture and the like from coming into contact with the solar cells 11. The encapsulant layer 14 is also called a sealing layer (sealant). The encapsulant layer 14 is formed, for example, by a lamination step described below, by use of two respective resin sheets constituting the encapsulant layers 14a, 14b. In this embodiment, the encapsulant layers 14a, 14b are closely adhered to each other between the solar cells 11, and between ends of the solar cell panel 16 and the solar cells 11 near the ends. The thickness of the encapsulant layer 14 is not particularly limited, and the thickness of each of the encapsulant layers 14a, 14b is preferably about 100 µm to 600 µm.

Hereinafter, the encapsulant layer 14 containing the wavelength conversion substances 30 will be further described in detail with reference to FIG. 2. FIG. 2 is a sectional view of the solar cell panel 16. In FIG. 2, the wavelength conversion substances 30 are illustrated by white circles.

Figure 2:
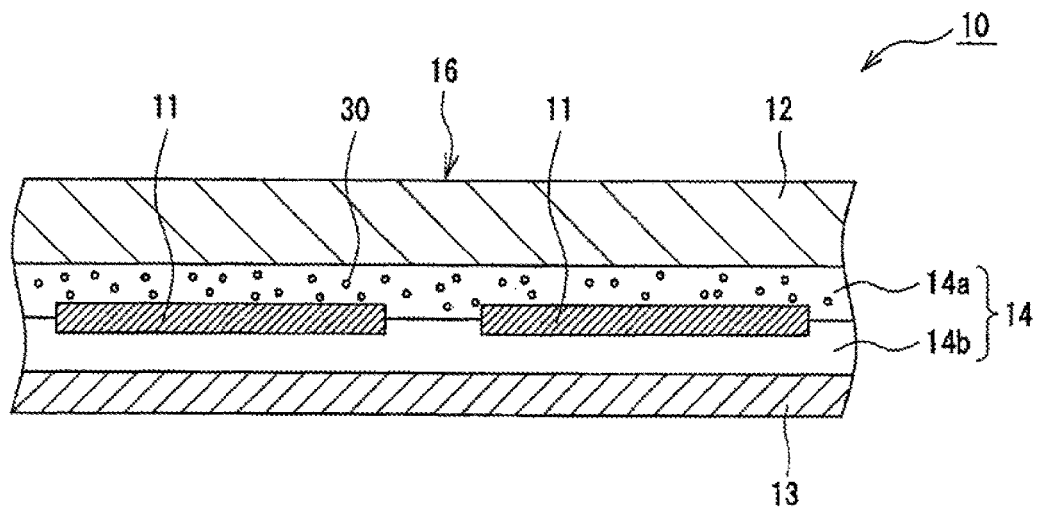
FIG. 2 is a sectional view of a solar cell panel constituting the solar cell module of the first embodiment (wiring materials are omitted).

As illustrated in FIG. 2, the wavelength conversion substances 30 are contained in the encapsulant layer 14a provided on at least the light receiving surface side of the solar cells 11. That is, the wavelength conversion substances 30 may be contained only in the encapsulant layer 14a (in this case, the concentration of the wavelength conversion substances 30 satisfies, of course, concentration in encapsulant layer 14a>concentration in encapsulant layer 14b). The wavelength conversion substances 30 may be contained in the encapsulant layer 14b provided on the rear surface side of the solar cells 11, but the concentration of the wavelength conversion substances 30 in the encapsulant layer 14a is higher than the concentration of the wavelength conversion substances 30 in the encapsulant layer 14b. When the wavelength conversion substances 30 are inorganic wavelength conversion substances, the concentration of the wavelength conversion substances 30 in the encapsulant layer 14a is, for example, 0.1 weight percent to 15 weight percent, and more preferably 1.5 weight percent to 10 weight percent. In a case of organic wavelength conversion substances, the concentration of the wavelength conversion substances 30 is, for example, 0.02 weight percent to 2.0 weight percent, and more preferably 0.05 weight percent to 0.8 weight percent.

Resin constituting the encapsulant layer 14 (encapsulant layers 14a, 14b) is preferably excellent in adhesion to the respective protection members and the solar cells 11, and highly impermeable to moisture. More specifically, examples of the resin constituting the encapsulant layer include olefin based resin obtained by polymerizing at least one selected from α-olefin of 2-20 C (for example, a random or block copolymer of polyethylene, polypropylene, ethylene, and other α-olefin), ester-based resin (for example, polycondensate of polyol and polycarboxylic acid or acid anhydride/acid lower alkyl ester thereof), urethane-based resin (for example, a polyaddition product with polyisocyanate and active hydrogen-containing compounds (such as diol, polyol, dicarboxylic acid, polycarboxylic acid, polyamine, polythiol)), epoxy-based resin (for example, opening polymer of polyepoxide, a polyaddition product with polyepoxide and the above active hydrogen-containing compound), and a copolymer of α-olefin, and vinyl carboxylate, acrylic ester, or other vinyl monomer.

Among these, the resin constituting the encapsulant layer is particularly preferably olefin based resin (particularly, a polymer containing ethylene), and a copolymer of α-olefin and vinyl carboxylate. As the copolymer of α-olefin and vinyl carboxylate, ethylene-vinyl acetate copolymer (EVA) is particularly preferable. However, a combination of resin constituting the encapsulant layer 14a (hereinafter, sometimes referred to as "resin 14a"), and resin constituting the encapsulant layer 14b (hereinafter, sometimes referred to as "resin 14b") needs to satisfy the following relation.

For the resin 14b, resin having a smaller diffusion coefficient of the wavelength conversion substances 30 than the diffusion coefficient of the resin 14a is used. The diffusion coefficient is a factor of proportionality which regulates the speed of diffusion appearing in Fick's laws of diffusion. The diffusion coefficient of the wavelength conversion substances 30 can be calculated by overlapping of a layer constituted from resin which contains the wavelength conversion substances 30 and which is to be measured, and an olefin based resin layer which does not contain the wavelength conversion substances 30, and obtaining the outflow speed of the wavelength conversion substances 30 from the resin layer to be measured. The outflow speed can be obtained by quantity by Gas Chromatography, or transmission spectrum measurement. The diffusion coefficient of the wavelength conversion substances 30 is made to satisfy diffusion coefficient of resin 14b<diffusion coefficient of resin 14a so that the wavelength conversion substances 30 contained in the encapsulant layer 14a can be inhibited from being diffused into the encapsulant layer 14b.

The diffusion coefficient of the wavelength conversion substances 30 in the resin 14a is, for example, $1\times10^{-12}$ to $1\times10^{-10}$ (m$^2$/s) at 120° C. The diffusion coefficient of the wavelength conversion substances 30 in the resin 14b is, for example, $1\times10^{-13}$ to $1\times10^{-11}$ (m$^2$/s) at 120° C.

The resin 14b preferably has a higher storage elastic modulus at 25° C. to 90° C. (hereinafter, simply referred to as a "storage elastic modulus") than that of the resin 14a. The storage elastic modulus is a ratio of elastic stress of the same phase as strain, and is represented by a real part of a complex modulus of elasticity. The larger a numeral value of the storage elastic modulus, the higher the elasticity of resin. The storage elastic modulus of each resin 14a, 14b can be measured by use of a dynamic viscoelasticity measuring device. The storage elastic modulus satisfies the relation storage elastic modulus of resin 14b>storage elastic modulus of resin 14a, so that the diffusion coefficient of the wavelength conversion substances 30 easily satisfies diffusion coefficient of resin 14b<diffusion coefficient of resin 14a. The storage elastic modulus (value at a frequency of 10 Hz in a tension mode at 25° C.) of the resin 14a is preferably $1\times10^7$ to $1\times10^8$ (Pa), and the storage elastic modulus of the resin 14b in the same condition is $1\times10^8$ to $1\times10^9$ (Pa).

The resin 14b preferably has a smaller intermolecular void size at 25° C. to 90° C. than that of the resin 14a. In other words, the resin 14b preferably has a smaller free volume at 25° C. to 90° C. than that of the resin 14a. The intermolecular void size means size of a void part which is not occupied by molecules (atoms). The intermolecular void size of each resin 14a, 14b can be measured by use of a positron annihilation method. The intermolecular void size satisfies void size of resin 14b<void size of resin 14a, so that the diffusion coefficient of the wavelength conversion substances 30 easily satisfies void size of resin 14b<void size of resin 14a. The intermolecular void size of the resin 14a is preferably 0.08 nm$^3$ to 0.12 nm$^3$, and the intermolecular void size of the resin 14b is preferably 0.05 nm$^3$ to 0.09 nm$^3$.

As long as the combination of the resins 14a, 14b satisfies the above relation, the combination is not particularly limited. The following is an example of the combination.

Example 1 resin 14a; low-density polyolefin, resin 14b: high-density polyolefin

Example 2 resin 14a; low molecular weight polyolefin, resin 14b: high molecular weight polyolefin Example 3 resin 14a; low molecular weight EVA, resin 14b: high molecular weight EVA The wavelength conversion substances 30 absorb, for example, ultraviolet light which is light having a wavelength shorter than 380 nm, and convert the ultraviolet light into light having a longer wavelength (e.g., 400 nm to 800 nm). In this case, the wavelength conversion substances 30 contribute to inhibition of deterioration of component materials due to the ultraviolet light. The wavelength conversion substances 30 are preferably substances that absorb ultraviolet light to emit visible light, but may be substances that absorb visible light or infrared light. Generally, the wavelength conversion substances 30 convert light having a shorter wavelength into light having a longer wavelength, but may convert light having a longer wavelength into light having a shorter wavelength, namely, cause so-called up-conversion light emission. The preferable conversion wavelength varies depending on the type of the solar cells 11.

In this embodiment, the solar cells 11 each have a heterojunction layer (amorphous semiconductor layer), and therefore the wavelength conversion substances 30 preferably absorb light having energy larger than a band gap of the heterojunction layer to convert the wavelength. That is, the wavelength conversion substances 30 preferably convert the light having the wavelength absorbed in the heterojunction layer. For example, the wavelength conversion substances 30 are used to absorb light having as wavelength $\lambda_\alpha$ absorbed by an amorphous semiconductor layer and to convert the light having a wavelength $\lambda_\alpha$ into light having a wavelength $\lambda_\beta$ which is not absorbed in the semiconductor layer. The wavelength $\lambda_\alpha$ is 600 nm or less.

Specific examples of the wavelength conversion substances 30 include semiconductor nanoparticles (quantum dots), inorganic compounds such as a luminescent metal complex, and organic compounds such as an organic fluorescence dye. Examples of the semiconductor nanoparticles can include zinc oxide (ZnO) nanoparticles, cadmium selenide (CdSe) nanoparticles, cadmium telluride (CdTe) nanoparticles, gallium nitride (GaN) nanoparticles, yttrium oxide ($Y_2O_3$) nanoparticles, and indium phosphide (InP) nanoparticles. Examples of the luminescent metal complex can include Ir complexes such as $[Ir(bqn)_3](PF_6)_3$, $[Ir(dpbpy)_3](PF_6)_3$, Ru complexes such as $[Ru(bqn)_3](PF_6)_3$, $[Ru(bpy)_3](ClO_4)_2$, Eu complexes such as $[Et(FOD)_3]phen$, $[Eu(TFA)_3]phen$, and Tb complexes such as $[Tb(FOD)_3]phen$, $[Tb(HFA)_3]phen$. Examples of the organic fluorescence dye can include a rhodamine dye, a coumarin dye, a fluorescein dye, and a perylene dye.

The wavelength conversion substances 30 substantially uniformly disperse into, for example, the encapsulant layer 14a. The encapsulant layer 14a may contain ultraviolet light absorbing substances that absorb ultraviolet light and do not emit light. In this case, there may be an uneven concentration distribution of the wavelength conversion substances 30 in the encapsulant layer 14a. For example, the concentration of the wavelength conversion substances 30 near the first protection member 12 may be made higher than the concentration of the wavelength conversion substances 30 near the solar cells 11. Additionally, two or more kinds of the wavelength conversion substances 30 may be added to the encapsulant layer 14a, or there may be an uneven concentration distribution of each wavelength conversion substance 30 in the encapsulant layer 14a.

The solar cell module 10 having the above configuration can be manufactured by laminating the string of the solar cells 11 connected by the wiring materials 15 by use of resin sheets constituting the first protection member 12, the second protection member 13, and the encapsulant layer 14. In a laminating device, for example, the first protection member 12, the resin sheet constituting the encapsulant layer 14a, the string of the solar cells 11, the resin sheet constituting the encapsulant layer 14b, and the second protection member 13 are sequentially laminated on a heater. The resin sheet constituting the encapsulant layer 14a contains the wavelength conversion substances 30 therein. This laminated body is heated to about 150° C., for example, in a vacuum state. Thereafter, the laminated body continues to be heated under atmospheric pressure while respective components are pressed onto the heater side, and the resin composition of the resin sheet is crosslinked, so that the solar cell panel 16 is obtained. Finally, the frame 17 and the like are mounted on the solar cell panel 16, so that the solar cell module 10 is obtained.

As described above, according to the solar cell module 10 having the above configuration, the wavelength conversion substances 30 in the encapsulant layer 14a disposed on the light receiving surface side of the solar cells 11 can be inhibited from being diffused into the encapsulant layer 14b disposed on the rear surface side of the solar cells 11. That is, in the solar cell module 10, the high concentration of the wavelength conversion substances 30 is maintained in the encapsulant layer 14a upon which a large quantity of light is incident, for a long period. Consequently, it is possible to improve efficiency of utilization of incident light, and improve photoelectric conversion efficiency.

Second Embodiment

Figure 3:
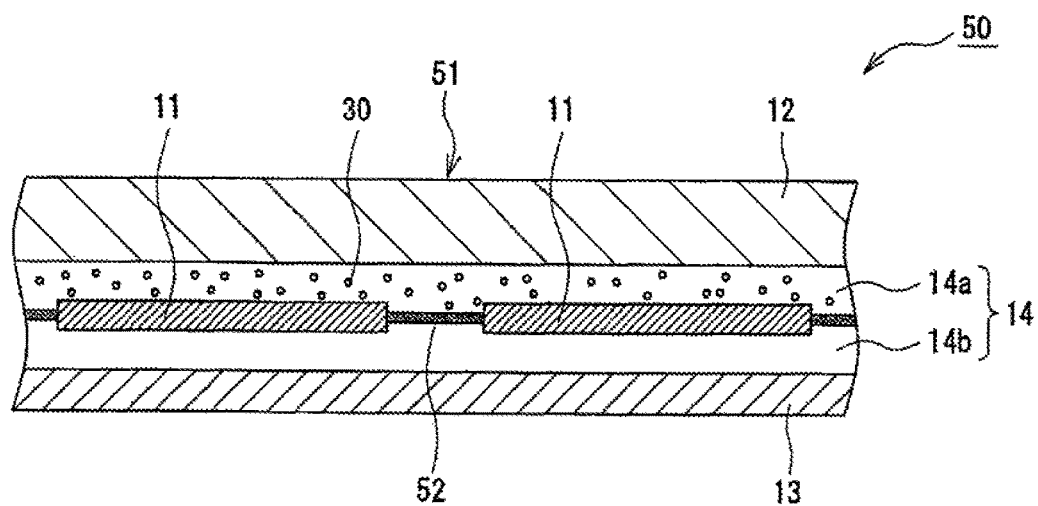
FIG. 3 is a sectional view of a solar cell panel constituting a solar cell module of a second embodiment (wiring materials are omitted).
Figure 4:
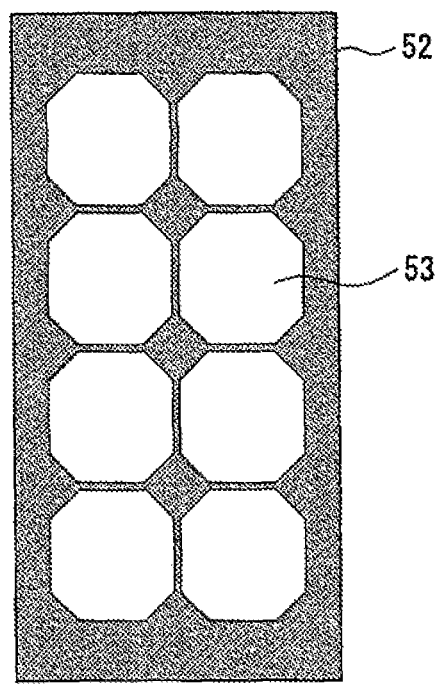
FIG. 4 is a plan view illustrating, an extracted diffusion inhibiting layer of FIG. 3.

Hereinafter, with reference to FIG. 3 and FIG. 4, a solar cell module 50 of a second embodiment will be described in detail. FIG. 3 is a sectional view of a solar cell panel 51 constituting the solar cell module 50. FIG. 4 is a plan view illustrating an extracted diffusion inhibiting layer 52 constituting the solar cell module 50. Hereinafter, differences from the first embodiment will be mainly described, with components similar to the components of the first embodiment being denoted by the same reference numerals, and repeated description omitted (the same applies to a third embodiment).

As illustrated in FIG. 3, the solar cell module 50 is different from the solar cell module 10 in that the diffusion inhibiting layer 52 which inhibits diffusion of wavelength conversion substances 30 is provided between an encapsulant layer 14a and an encapsulant layer 14b. The diffusion inhibiting layer 52 is preferably interposed between both layers over substantially the whole area such that the encapsulant layer 14a is not in contact with the encapsulant layer 14b. The diffusion inhibiting layer 52 is provided, for example, between voids of adjacent solar cells 11, between ends of the solar cell panel 51 and the solar cells 11 near the ends.

The diffusion inhibiting layer 52 is formed of a material having a smaller diffusion coefficient of the wavelength conversion substances 30 than that of the resin 14a. In this embodiment, the diffusion inhibiting layer 52 is formed by use of a resin sheet which does not have a metal layer and an inorganic compound layer, and a resin constituting the diffusion inhibiting layer 52 (hereinafter, sometimes referred to as "resin 52") has wavelength conversion substances 30 of smaller diffusion coefficient than in the resin 14a, The resin 52 preferably has a higher storage elastic modulus than that of the resin 14a, and preferably a smaller intermolecular void size than that of the resin 14a. The relation of the resin 14a and the resin 52 is the same as the relation of the resin 14a and the resin 14b in the first embodiment, for example. Furthermore, the resin 52 preferably has wavelength conversion substances 30 of smaller diffusion coefficient than in the resin 14b.

As illustrated in FIG. 4, the diffusion inhibiting layer 52 is formed of a resin sheet formed with through holes 53 at portions where the solar cells 11 are disposed, and the resin sheet is preferably provided to be interposed between a resin sheet constituting the encapsulant layer 14a and a resin sheet constituting the encapsulant layer 14b. In this embodiment, the solar cells 11 each have a shape formed by obliquely cutting four corners of a substantial square in plan view, and the through holes 53 each have a shape which is substantially the same as the solar cell 11. The through holes 53 are formed to correspond to the number of the solar cells 11 (eight in the example illustrated in FIG. 4). In the diffusion inhibiting layer 52, the through holes 53 may be formed so as to be larger than the solar cells 11 and may be provided so as not to overlap with the solar cells 11. However, the through holes 53 are preferably formed so as to be slightly smaller than the solar cells 11 and so as not to overlap with the end edges of the solar cells 11.

According to the solar cell module 50 having the above configuration, similarly to the solar cell module 10, the wavelength conversion substances 30 in the encapsulant layer 14a can be inhibited from being diffused on the rear surface side of the solar cells 11. Furthermore, in a case of the solar cell module 50, the diffusion inhibiting layer 52 inhibits diffusion of the wavelength conversion substances 30, and therefore design freedom of the encapsulant layer 14b is improved compared to the case of the solar cell module 10.

Third Embodiment

Figure 5:
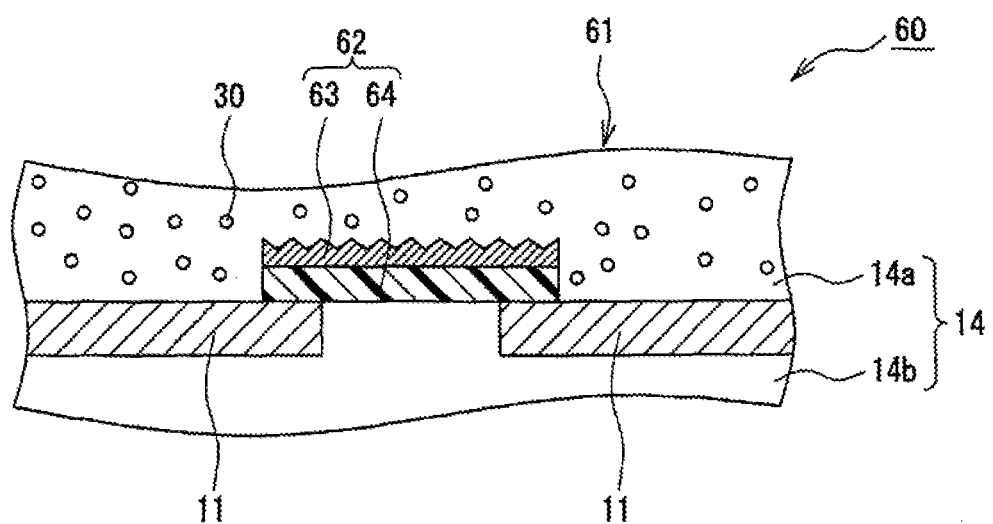
FIG. 5 is a sectional view of a solar cell panel constituting a solar cell module of a third embodiment (wiring materials are omitted).

Hereinafter, with reference to FIG. 5, a solar cell module 60 of a third embodiment will be described in detail. FIG. 5 is a sectional view of a solar cell panel 61 constituting the solar cell module 60, and illustrates a void portion between adjacent solar cells 11.

As illustrated in FIG. 5, the solar cell module 60 is similar to the solar cell module 50 in that a diffusion inhibiting layer 62 which inhibits diffusion of wavelength conversion substances 30 is provided between an encapsulant layer 14a and an encapsulant layer 14b. On the other hand, the solar cell module 60 is different from the solar cell module 50 in that the diffusion inhibiting layer 62 is constituted by a resin layer 63 and a metal layer 64. Resin constituting the resin layer 63 is not particularly limited, and may be, for example, resin similar to the resin 14a, 14b.

Metal constituting the metal layer 64 of the diffusion inhibiting layer 62 has a diffusion coefficient of the wavelength conversion substances 30 which is substantially zero (smaller diffusion coefficient of the wavelength conversion substances 30 than in the resin 14a). Therefore, the diffusion inhibiting layer 62 is interposed between the encapsulant layer 14a and the encapsulant layer 14b over substantially the whole area, so that it is possible to significantly inhibit diffusion of the wavelength conversion substances 30 to the encapsulant layer 14b. The metal constituting the metal layer 64 has a higher storage elastic modulus than that of the resin 14a.

In the example illustrated in FIG. 5, on the light receiving surface side of the solar cells 11, the diffusion inhibiting layer 62 is disposed so as to overlap with end edges of the solar cells 11. The diffusion inhibiting layer 62 may be disposed on the rear surface side of the solar cells 11. In either case, from a viewpoint of insulation securement, the diffusion inhibiting layer 62 is disposed such that the resin layer 63 is on the solar cell 11 side. The metal layer 64 functions as, for example, a reflection layer which diffuses and reflects incident light passing from voids between the solar cells 11 to the rear surface side, and allows the light to be incident upon the solar cells 11 again. In order to facilitate diffusion and reflection of light, irregularities may be formed on a surface of the metal layer 64.

The design of each embodiment can be suitably changed without departing from the object of the present disclosure.

For example, the diffusion inhibiting layer 52 is provided by use of the resin sheet having the through holes 53 in the above embodiment, but may be a diffusion inhibiting layer by use of a resin sheet having no through hole, or by disposing a plurality of strip-shaped sheets in the voids between the solar cells 11. Additionally, the diffusion inhibiting layer may have an inorganic compound layer of silica or the like, in place of the metal layer 64.

REFERENCE SIGNS LIST 10, 50, 60 Solar cell module
11 Solar cell
12 First protection member
13 Second protection member
14, 14a, 14b Encapsulant layer
15 Wiring material
16, 51, 61 Solar cell panel
17 Frame
30 Wavelength conversion substance
52, 62 Diffusion inhibiting layer
53 Through hole
63 Resin layer
64 Metal layer

The invention claimed is:

1. A solar cell module comprising:
   a solar cell;
   a first protection member provided on a light receiving surface side of the solar cell;
   a second protection member provided on a rear surface side of the solar cell;
   an encapsulant layer that includes a first encapsulant layer disposed between the solar cell and the first protection member, and a second encapsulant layer disposed between the solar cell and the second protection member, and that seals the solar cell; and
   a wavelength conversion substance that is contained in the first encapsulant layer and in the second encapsulant layer, and that absorbs light having a specified wavelength, and converts the wavelength, wherein
   concentration of the wavelength conversion substance in the first encapsulant layer is higher than concentration of the wavelength conversion substance in the second encapsulant layer, and
   resin constituting the second encapsulant layer has a smaller diffusion coefficient of the wavelength conversion substance than the diffusion coefficient of resin constituting the first encapsulant layer.

2. The solar cell module according to claim 1, wherein the resin constituting the second encapsulant layer has a higher storage elastic modulus at 25° C. to 90° C. than that of the resin constituting the first encapsulant layer.

3. The solar cell module according to claim 1, wherein the resin constituting the second encapsulant layer has a smaller intermolecular void size at 25° C. to 90° C. than that of the resin constituting the first encapsulant layer.

4. The solar cell module according to claim 1, wherein the wavelength conversion substance is an inorganic semiconductor nanoparticle.

5. The solar cell module according to claim 1, wherein the wavelength conversion substance is a luminescent metal complex.

6. The solar cell module according to claim 1, wherein the wavelength conversion substance is a fluorescence dye.

7. The solar cell module according to claim 1, wherein concentration of the wavelength conversion substance in a first region of the first encapsulant layer closer to the first protection member is higher than in a second region of the first encapsulant layer closer to the solar cell.

* * * * *